(12) United States Patent
Chinda et al.

(10) Patent No.: US 7,681,310 B2
(45) Date of Patent: Mar. 23, 2010

(54) METHOD FOR FABRICATING DOUBLE-SIDED WIRING BOARD

(75) Inventors: Akira Chinda, Hitachi (JP); Nobuaki Miyamoto, Hitachi (JP)

(73) Assignee: Hitachi Cable, Ltd., Tokyo (JP)

( * ) Notice: Subject to any disclaimer, the term of this patent is extended or adjusted under 35 U.S.C. 154(b) by 228 days.

(21) Appl. No.: 11/255,025

(22) Filed: Oct. 21, 2005

(65) Prior Publication Data

US 2006/0219428 A1 Oct. 5, 2006

(30) Foreign Application Priority Data

Mar. 29, 2005 (JP) ............................. 2005-096270

(51) Int. Cl.
*H01K 3/10* (2006.01)
(52) U.S. Cl. ..................... 29/852; 29/830; 156/247; 174/262
(58) Field of Classification Search .......... 29/830, 29/846–849, 851–853; 174/255, 259, 262; 156/233, 246, 247; 216/17; 205/125
See application file for complete search history.

(56) References Cited

U.S. PATENT DOCUMENTS

| 3,948,701 | A | * | 4/1976 | Fasbender et al. | 216/17 |
|---|---|---|---|---|---|
| 5,319,159 | A | * | 6/1994 | Watanabe et al. | 174/262 |
| 5,495,665 | A | * | 3/1996 | Carpenter et al. | 29/830 |
| 5,746,868 | A | * | 5/1998 | Abe | 29/846 |
| 6,708,404 | B1 | * | 3/2004 | Gaku et al. | 29/852 |
| 6,739,040 | B1 | | 5/2004 | Nakamura et al. | |

FOREIGN PATENT DOCUMENTS

| CN | 1302179 | 7/2001 |
|---|---|---|
| CN | 1302531 | 7/2001 |
| EP | 1 102 524 A1 | 5/2001 |
| JP | 3593234 | 9/2004 |
| TW | 407453 | 1/2000 |
| TW | 469758 | 12/2001 |
| WO | WO00/69238 | 11/2000 |

OTHER PUBLICATIONS

Taiwanese Office Action Dated Nov. 22, 2006, with partial English language translation.

* cited by examiner

*Primary Examiner*—Donghai D. Nguyen
(74) *Attorney, Agent, or Firm*—McGinn Intellectual Property Law Group, PLLC

(57) ABSTRACT

A method is provided for fabricating a double-sided wiring board for mounting an electronic component thereon having metal wiring patterns formed both on upper and lower sides of an electrically-insulating board. The metal wiring patterns are electrically connected each other through a through-hole and/or a blind via-hole. The method has the steps of: laminating a metal layer with a support substrate on at least one side of the electrically-insulating board; removing the support substrate from the metal layer so that the metal layer is left on the electrically-insulating board; and forming the through-hole and/or the blind via-hole in the electrically-insulating board.

9 Claims, 6 Drawing Sheets

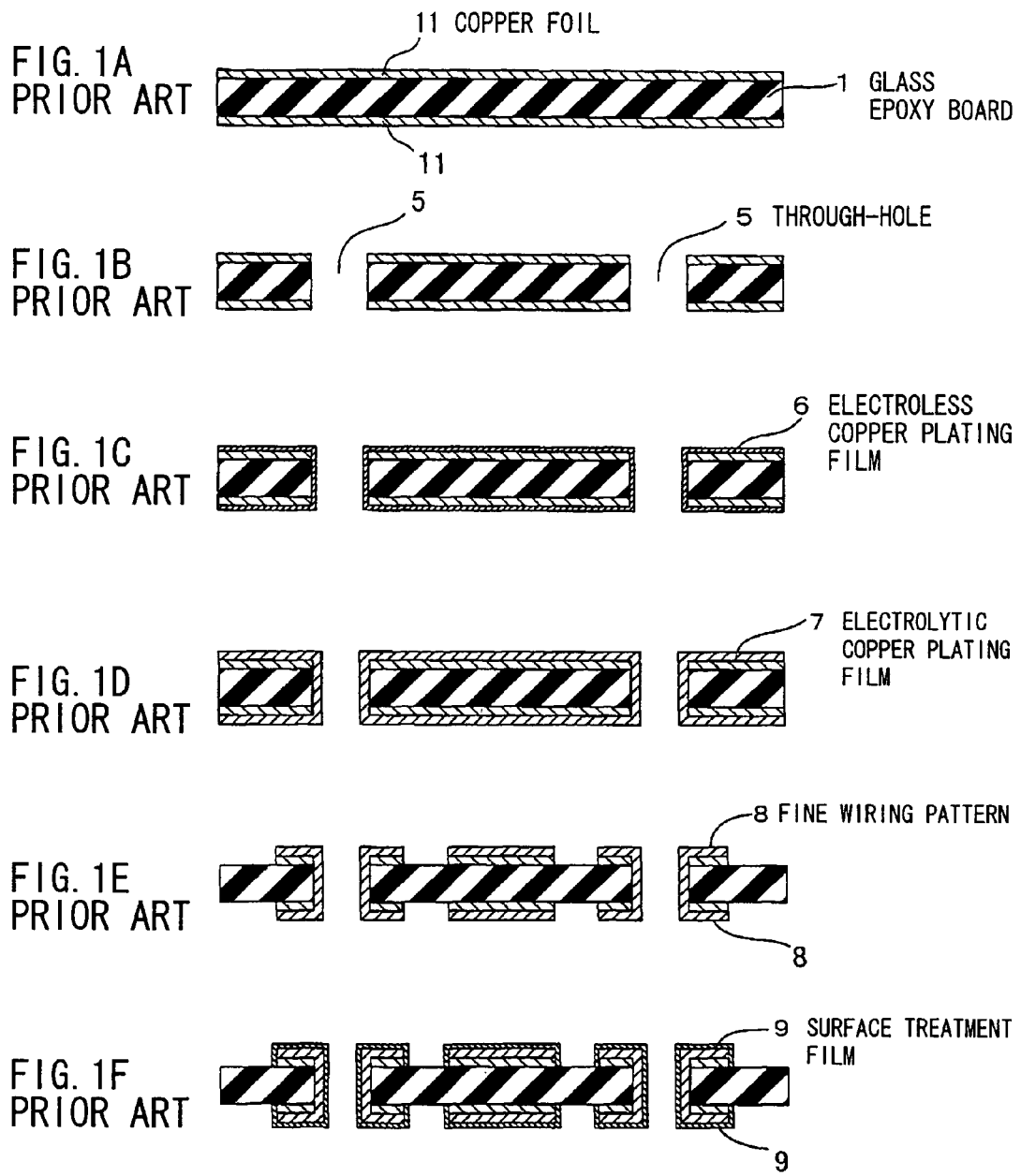

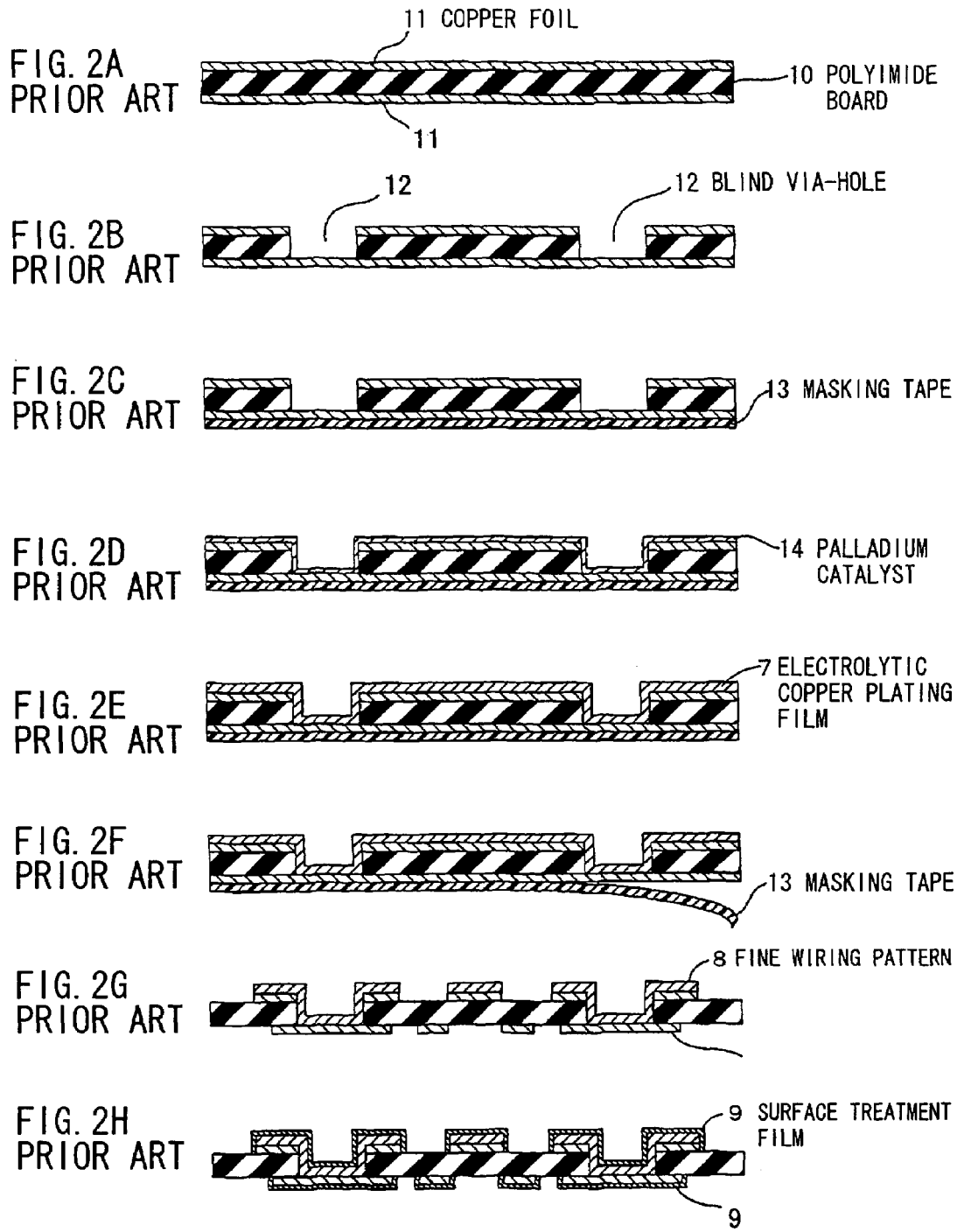

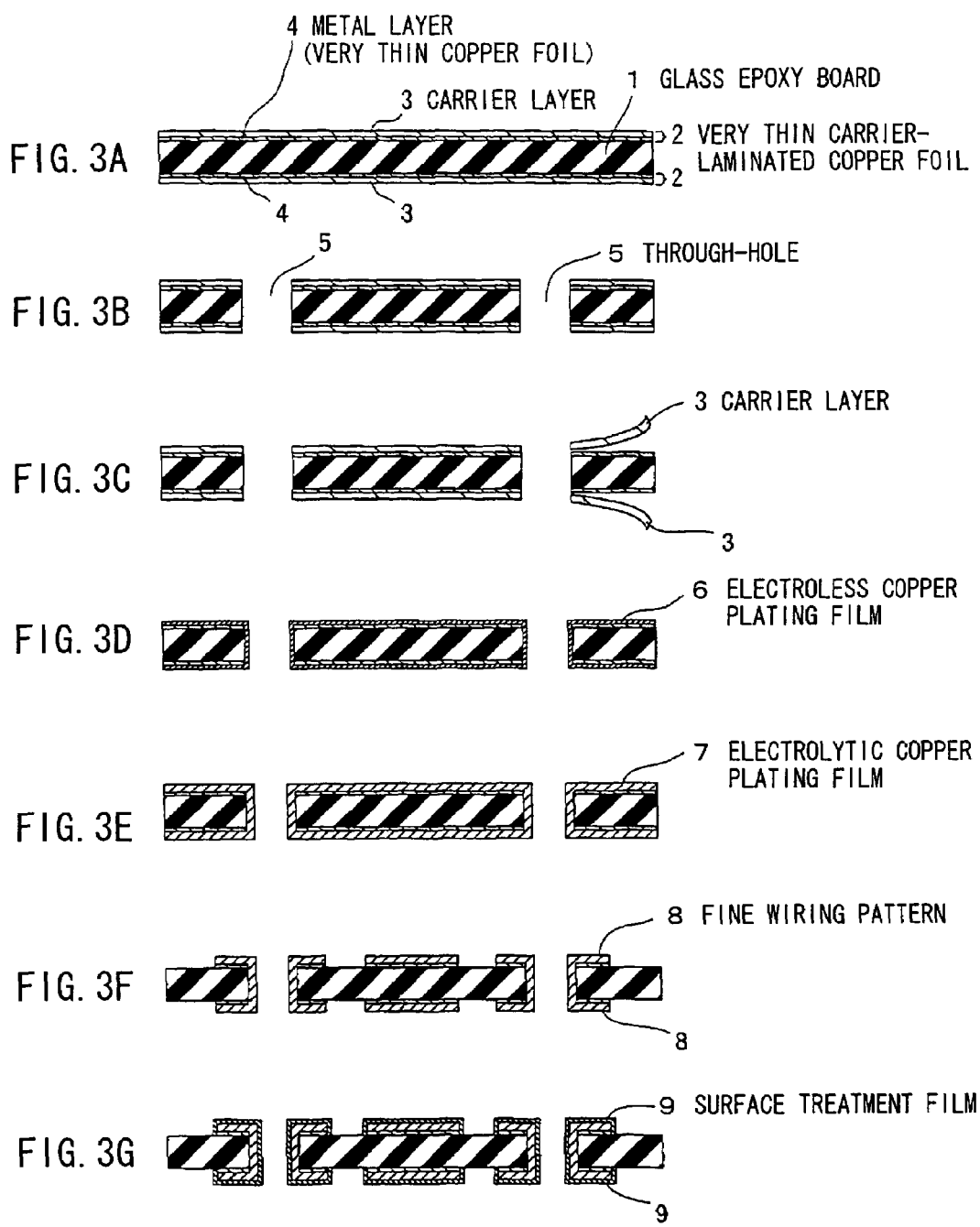

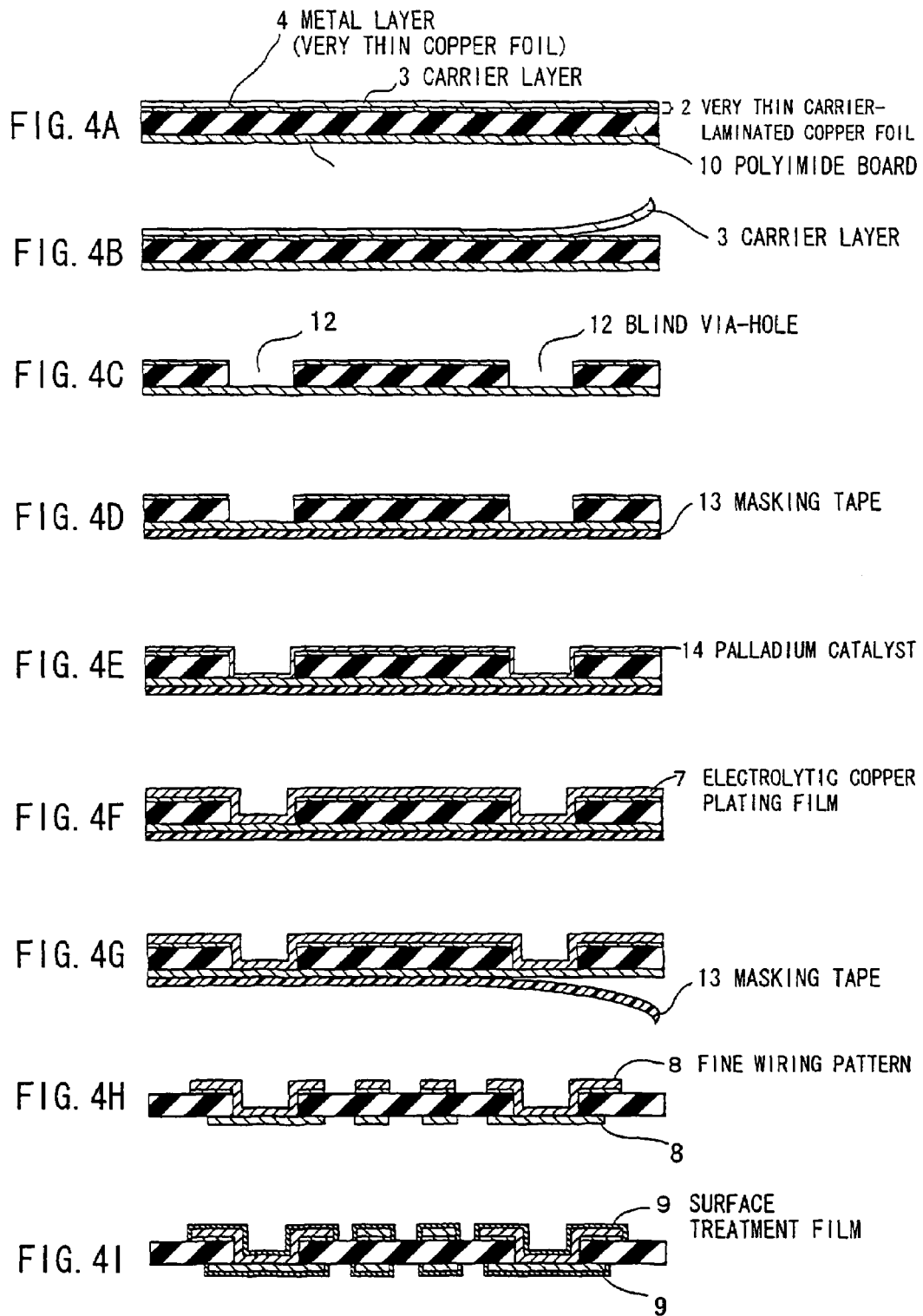

4 METAL LAYER (VERY THIN COPPER FOIL)
3 CARRIER LAYER
2 VERY THIN CARRIER-LAMINATED COPPER FOIL
10 POLYIMIDE BOARD

3 CARRIER LAYER

12 BLIND VIA-HOLE

13 MASKING TAPE

14 PALLADIUM CATALYST

7 ELECTROLYTIC COPPER PLATING FILM

3 CARRIER LAYER
13 MASKING TAPE

8 FINE WIRING PATTERN
8

9 SURFACE TREATMENT FILM
9

US 7,681,310 B2

METHOD FOR FABRICATING DOUBLE-SIDED WIRING BOARD

The present application is based on Japanese patent application No. 2005-096270, the entire contents of which are incorporated herein by reference.

BACKGROUND OF THE INVENTION

1. Field of the Invention

The present invention relates to a double-sided wiring board fabrication method, a double-sided wiring board and a base material therefor and, particularly, to a double-sided wiring board fabrication method, a double-sided wiring board and a base material therefor, capable of forming a fine wiring even if a copper film electro deposited on exposed copper foil becomes thick during electroplating a metal layer for electrical conduction on the wall of a through-hole or blind via-hole.

2. Description of the Related Art

With the rapid flow of size reduction, high integration, and performance enhancement of electronic devices, double-sided wiring boards attract attention as boards for mounting IC chips. Double-sided wiring boards have a copper foil pattern layer on both upper and lower (front and back) sides of the board made of glass epoxy, polyimide, or the like, as an insulating layer, and through-holes or blind via-holes (via-holes having a bottom) formed at any positions of the front and back patterns, where the inner walls of the through-holes and blind via-holes are made electrically conductive by plating treatment or paste embedding (See Japanese patent No. 3593234, for example).

It has been confirmed that such double-sided wiring boards are advantageous in high-density packaging because of wiring patterns on both front and back sides thereof, and excellent in electrical properties as well.

FIGS. 1A-1F are cross-sectional views showing the respective steps of a conventional double-sided wiring board fabrication process using a glass epoxy board (through-hole processing).

In the step of making a double-sided wiring base material, a copper foil 11 is laminated on both sides of a glass epoxy board 1 (FIG. 1A). Taking handling into account, the copper foil 11 is generally not less than 18 µm thick.

Generally, the method for electrical conduction at via-holes in both upper and lower wiring (FIG. 1B) forms through-holes 5 at desired positions by means of a laser, punch, drill, or the like before etching processing for forming wiring in the copper foil 11; (FIG. 1C) plates the exposed hole walls with electroless copper to form an electroless copper plating film 6 for simplified electrical conduction; and subsequently (FIG. 1D) applies electrolytic copper plating to form an electrolytic copper plating film 7 for making the film thickness thick.

As the initial treatment for electrical conduction for the through-hole walls, the above-mentioned electroless copper plating treatment has many uses in glass epoxy boards, but palladium catalyst addition, conductive material coating, or the like may be used.

The opening diameter of the through-holes 5 is as fine as the minimum 100 µm in the case of punching or drilling. An electroless copper plating solution is caused to penetrate into these fine openings to form a thin copper coating film, and the upper and lower copper foil 11 is caused to serve as a cathode, followed by causing current to flow, allowing further thick copper plating to be electrodeposited on the through-hole 5 walls and the copper foil 11, which result in electrical conduction in the through-hole 5 formation portions of the copper foil 11 established on both upper and lower sides of the glass epoxy board 1 (insulative base material).

A double-sided wiring board is completed generally by the subsequent photoetching processing of the copper foil 11 into a finished fine wiring pattern 8 (FIG. 1E), to which is further applied a surface treatment film 9 (FIG. 1F) matching the purposes of mounting of electronic components, packaging on the print wiring board, bonding to the glass board, attaching to connector terminals, and so on.

FIGS. 2A-2H are cross-sectional views showing the respective steps of a conventional double-sided wiring board (flexible double-sided wiring board) fabrication process using a polyimide board (blind via-hole processing).

In the step of making a double-sided wiring base material, a copper foil 11 is laminated on both sides of a polyimide board 10 formed of a polyimide tape having a flexible property (FIG. 2A). For the flexible double-sided wiring board taking advantage of such a polyimide tape property, as thin a copper foil material as possible is used to make the copper foil 11 thin, but has a limit up to the order of 12 µm thickness as it stands.

The flexible double-sided wiring board requires a fine pitch at least in signal wiring particularly in order to enhance wiring density. For this reason, the holes for electrical conduction are generally non-through blind via-holes 12 (FIG. 2B).

The blind via-holes 12 are often formed by laser processing having many uses for fine wiring formation, because the via opening diameter is 40-80 µm, which is finer than the opening diameter formed by punching or drilling.

The treatment for electrical conduction within the blind via-holes 12 is substantially the same as in the case of the glass epoxy board 1 of FIG. 1, but a masking tape (insulating tape) 13 (FIG. 2C) is mounted on the copper foil surface opposite the via-hole opening surface to mask it so as not to make the film thick, because the thick copper foil film for signal wiring formation formed during copper plating of the via-holes causes extreme difficulty in etching formation of finer-pitch wiring.

Subsequently, a palladium catalyst 14 (FIG. 2D) is added to the inner walls of the blind via-holes 12 for simplified electrical conduction, followed by electrolytic copper plating to form an electrolytic copper plating film 7 (FIG. 2E) for making the film thickness thick.

As the initial treatment for electrical conduction for the blind via-hole walls, electroless copper plating treatment, conductive material coating, or the like may be used for or combined with the above-mentioned palladium catalyst addition.

A flexible double-sided wiring board is completed by subsequent masking tape 13 stripping (FIG. 2F) followed by photoetching processing of the copper foil 11 into a finished fine wiring pattern 8 (FIG. 2G), to which is further applied a surface treatment film 9 (FIG. 2H) matching the purposes of mounting of electronic components, packaging on the print wiring board, bonding to the glass board, attaching to connector terminals, and so on.

According to the conventional double-sided wiring boards, however, there is the problem of difficulty in fine wiring formation because the copper plating thickness for the electrically conductive treatment of the through-holes or blind via-holes is required to be as thick as more than 15 µm from the point of view of ensuring reliability in heat resistance and moisture resistance of the boards, in which case the copper foil thickness combined with the original thickness can be more than about 30 µm by applying copper plating to both the upper and lower copper foil surfaces in the case of the through-holes, and to the unmasked copper foil surface on the via-hole open side in the case of the blind via-holes with one of the upper and lower copper foil surfaces masked with the insulating tape or the like. In order to form fine wiring by etching, thinner copper foil thickness is advantageous. For instance, the wiring pitch limit which is possible to form by etching is 100 μm for 35 μm copper foil thickness, 80 μm for 25 μm copper foil thickness, and 60 μm for 18 μm copper foil thickness.

For the strong demand for the size-reduction of electronic components, the wiring pitch of wiring boards for mounting electronic components is increasingly narrower, which therefore requires making wiring still finer.

SUMMARY OF THE INVENTION

It is an object of the present invention to provide a double-sided wiring board fabrication method, a double-sided wiring board and a base material therefor, capable of forming fine wiring even if a copper film electrodeposited on exposed copper foil becomes thick during electroplating a metal layer for electrical conduction on a wall of a through-hole or blind via-hole.

(1) According to one aspect of the invention, a method for fabricating a double-sided wiring board for mounting an electronic component thereon comprising metal wiring patterns formed both on upper and lower sides of an electrically-insulating board, the metal wiring patterns being electrically connected each other through a through-hole and/or a blind via-hole comprises the steps of:

laminating a metal layer with a support substrate on at least one side of the electrically-insulating board;

removing the support substrate from the metal layer so that the metal layer is left on the electrically-insulating board; and forming the through-hole and/or the blind via-hole in the electrically-insulating board.

(2) According to another aspect of the invention, a method for fabricating a double-sided wiring board for mounting an electronic component thereon comprising metal wiring patterns formed both on upper and lower sides of an electrically-insulating board, the metal wiring patterns being electrically connected each other through a through-hole and/or a blind via-hole comprises the steps of:

laminating a metal layer with a support substrate on at least one side of the electrically-insulating board;

forming the through-holes and/or the blind via-holes in the electrically-insulating board; and removing the support substrate from the metal layer so that the metal layer is left on the electrically-insulating board.

(3) According to another aspect of the invention, a method for fabricating a double-sided wiring board for mounting electronic components thereon comprising metal wiring patterns formed both on upper and lower sides of an electrically-insulating board, the metal patterns being electrically connected each other through a blind via-hole, comprising the steps of:

laminating a metal layer with a support substrate on both sides of the electrically-insulating board;

removing the support substrate located on an open side of the blind via-hole and subsequently forming the blind via-hole in the electrically-insulating board, or forming the blind via-hole in the electrically-insulating board and subsequently removing the support substrate located on the open side of the blind via-holes; and making the electrical connection on a wall of the blind via-hole and subsequently removing the support substrate located on opposite the open side of the blind via-hole.

(4) According to another aspect of the invention, a double-sided wiring board for mounting an electronic component, comprising:

an electrically-insulating board;

metal wiring patterns formed both on upper and lower sides of the electrically-insulating board; and a through-hole and/or a blind via-hole formed in the electrically-insulating board for allowing electrical conduction between the metal wiring patterns therethrough, wherein:

the metal wiring patterns comprising a first metal layer, the through-hole and/or a blind via-hole comprises a second metal layer formed on a wall thereof, and the first metal layer comprises a thickness 1 to 8 μm greater than the second metal layer.

(5) According to another aspect of the invention, a base material for fabricating a double-sided wiring board for mounting an electronic component comprises:

an electrically-insulating board;

metal wiring patterns formed both on upper and lower sides of the electrically-insulating board; and a through-hole and/or a blind via-hole formed in the electrically-insulating board for allowing electrical conduction between the metal wiring patterns therethrough, wherein:

a metal layer with a support substrate is laminated on at least one side of the electrically-insulating board.

In the present invention, a double-sided wiring board can be provided which is suited to the formation of a fine wiring while preventing increase in total thickness of a conductive film such as copper film formed on its insulating board.

BRIEF DESCRIPTION OF THE DRAWINGS

The preferred embodiments according to the invention will be explained below referring to the drawings, wherein:

FIGS. 1A-1F are cross-sectional views showing the respective steps of the conventional double-sided wiring board fabrication process using the glass epoxy board (through-hole processing);

FIGS. 2A-2H are cross-sectional views showing the respective steps of the conventional double-sided wiring board (flexible double-sided wiring board) fabrication process using the polyimide board (blind via-hole processing);

FIGS. 3A-3G are cross-sectional views showing the respective steps of a double-sided wiring board fabrication process of preferred embodiment 1 according to the invention using a glass epoxy board (through-hole processing);

FIGS. 4A-4I are cross-sectional views showing the respective steps of a double-sided wiring board (flexible double-sided wiring board) fabrication process of preferred embodiment 2 according to the invention using a polyimide board (blind via-hole processing);

DETAILED DESCRIPTION OF THE PREFERRED EMBODIMENTS

Figure 5A:
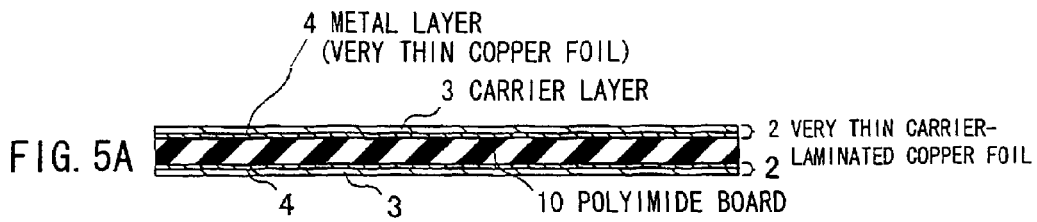
FIGS. 5A-5I are cross-sectional views showing the respective steps of a double-sided wiring board (flexible double-sided wiring board) fabrication process of preferred embodiment 3 according to the invention using a polyimide board (blind via-hole processing)

A double-sided wiring board fabrication method of the present invention comprises mainly the steps of: making a double-sided wiring base material; stripping a carrier layer; forming through-holes and/or blind via-holes; performing electrically conductive treatment; performing etching treatment; and metal-plating treatment. The method may include the step of mounting/stripping a masking tape, etc., according to needs. Each of their steps is explained in detail below.

The step of making a double-sided wiring base material comprises bonding a metal layer with a support substrate to both sides or one side of an electrically-insulating board such as a polyimide or glass epoxy base material or the like, to make a double-sided wiring base material. If the metal layer with the support substrate is laminated on one side only, copper foil with a typical thickness may be laminated on the other.

Here, the metal layer with the support substrate comprises a carrier layer formed of a metal as raw material, a release layer formed over the carrier layer, and a metal layer formed over the release layer. As its preferred concrete example, there is very thin carrier-laminated copper foil.

The very thin carrier-laminated copper foil is a material, in which, to provide thin copper foil, a release layer with weak bond strength so as to be stripped in a subsequent step is formed over thick metal foil (carrier layer: in many cases, copper foil) on the order of 15-35 $\mu$m, followed by forming thin metal foil on the order of 1-5 $\mu$m by electrolysis. As commercial very thin carrier-laminated copper foil, there are "CopperBond® Extra Thin Foil" (Japan Olin Brass Corp.), "MicroThin™" Mitsui Mining & Smelting Co. Ltd.), etc.

For the release layer, there may be used, without particular limitation, any material capable of bonding and stripping the carrier layer and the metal layer to and from each other, but it is desirable to use materials having smaller bond strength than the bond strength between the electrically-insulating board and the metal layer. In this regard, U.S. Pat. No. 6,346,335 discloses a copper foil composite with a release layer that may be an admixture of a metal such as nickel or chromium and a non-metal such as chromium oxide, nickel oxide, chromium phosphate or nickel phosphate, provides a peel strength for a metal foil layer from a carrier strip that is typically on the order of 0.1 pound per inch to 2 pounds per inch. Furthermore, U.S. Pat. No. 6,270,889 discloses a composite foil comprising an organic release layer between a metal carrier layer and an ultra-thin copper foil, the organic release layer preferably being a nitrogen-containing compound, a sulfur-containing compound, or a carboxylic acid, which provides a uniform bond strength which is adequate to prevent separation of the carrier and ultra-thin copper foil during handling and lamination, but which is significantly lower than the peel strength of a copper/substrate bond, so that the carrier can easily be removed after lamination of the composite foil to an insulating substrate. The U.S. Pat. Nos. 6,346,335 and 6,270,889 are incorporated by reference in their entireties herein.

Also, for the metal layer formed over the release layer, there may be used, besides copper foil, copper alloy foil, stainless foil, aluminum or aluminum alloy foil, nickel or nickel alloy foil, tin or tin alloy foil, etc. Its thickness is thinner than the thickness of the above-mentioned carrier layer, preferably not more than 8 $\mu$m, more preferably not more than 5 $\mu$m, and even more preferably not more than 3 $\mu$m. On the other hand, the metal layer preferably has a thickness of 1 $\mu$m or more. If the thickness is less than 1 $\mu$m, the metal layer becomes difficult to handle.

For the lamination of the very thin carrier-laminated copper foil and the electrically-insulating board, an adhesive may be used, or in the case of the electrically-insulating board formed of thermoplastic resin, the copper foil may also be laminated by heating and softening the board. Alternatively, there may be used a casting method in which polyamic acid (polyimide precursor varnish) is applied to the very thin carrier-laminated copper foil, followed by thermal curing. Or these methods may be combined.

After making the double-sided wiring base material, the carrier layer formed of relatively thick metal foil is stripped to thereby complete a double-sided wiring board molding material having a very thin copper foil layer of the order of 1-5 $\mu$m on both sides of the insulative board.

The method for forming through-holes and/or blind via-holes in this double-sided wiring board molding material and applying thereto plating for electrically conductive treatment may use the conventional method. Namely, through-holes or blind via-holes are formed at desired positions by means of a laser, punch, drill, or the like, and the insulating inner walls of the holes are made electrically conductive by means of electroless copper plating, palladium catalyst addition, conductive material coating, or the like, followed by immersion in an electrolytic copper plating solution and causing current to flow (copper foil serving as a cathode), allowing copper to be electrodeposited on the hole inner walls and the copper foil, which results in electrical conduction.

A flexible double-sided wiring board of the invention is completed by subsequent photoetching processing of the copper foil into finished wiring, to which is further applied a surface treatment film (metal plating) matching the purposes of mounting of electronic components, packaging on the print wiring board, bonding to the glass board, attaching to connector terminals, and so on.

In the above explanation, although the very thin carrier-laminated copper foil is laminated at least on one side of the insulative board, followed by stripping of the carrier layer and subsequent processing for through-hole or via-hole formation, the hole processing may be performed before stripping the carrier layer. In this case, because the carrier layer serves as the support substrate during hole processing, there is the advantage of facilitating conveyance. The holes are formed, followed by stripping of the carrier layer and subsequent copper plating.

In the flexible double-sided wiring board in which are provided blind via-holes, when the very thin carrier-laminated copper foil is laminated on both sides of the insulative board, after via-hole processing, the insulating tape is mounted on the copper foil surface opposite the via-hole opening surface so as to mask it, followed by via-hole plating and stripping of the masking tape, which allows the copper foil opposite the opening surface to be as very thin as the order of 1-5 $\mu$m, and which also makes it possible to form even finer pitch wiring of not more than 30 $\mu$m by etching. The very thin copper foil layer on the order of 1-5 $\mu$m can also serve as a seed layer during wiring formation by a semi-additive method.

The flexible double-sided wiring board of the invention fabricated by the above-described fabrication method is the double-sided wiring board for mounting electronic components, having the metal wiring pattern formed on both upper and lower sides of the electrically-insulating board, between which electrical conduction is caused through the through-holes and/or via-holes at any positions, in which the metal wiring pattern comprises the metal layer obtained from the metal layer with the support substrate laminated on the electrically-insulating board, and the plating layer formed during plating through-holes or blind via-holes.

Because in the double-sided wiring board of the invention, the thickness of copper foil at least before plating the through-holes or blind via-holes is as very thin as the order of 1-8 μm, when plating on the order of 15 μm is applied to the inner walls of the holes, even if copper plating with the same thickness is electrodeposited on exposed copper foil, the thickness of the copper foil layer can be ensured to be as thin as the order of 16-23 μm. This facilitates fine wiring formation by etching, combining with a synergistic effect of high-density wiring formation by the double-sided wiring, thereby allowing ensuring further enhancement of wiring density.

In flexible double-sided wiring boards using polyimide base material, etc., the maintenance of flexibility (bending property) after wiring board processing is also important. Because in the flexible double-sided wiring board of the present invention, the thickness of copper foil on one side can be about 23 μm or less, its flexibility is good, compared to conventional flexible boards. This reduces the needs of the additional step of thinning copper foil by chemical grinding, and of devising design so as not to leave copper foil at bending positions, and so on, which were performed in conventional flexible boards.

In the preferred embodiments of the double-sided wiring board of the invention, metal wiring patterns have a fine wiring pattern with a minimum pitch of not more than 80 μm. In the more preferred embodiments, metal wiring patterns have a fine wiring pattern with a minimum pitch of not more than 60 μm.

The specific embodiments of the invention will hereinafter be explained, but the invention is not limited thereto.

Embodiment 1

FIGS. 3A-3G are cross-sectional views showing the respective steps of a double-sided wiring board fabrication process of embodiment 1 according to the invention using a glass epoxy board (through-hole processing).

A 100 μm thick and 500 mm square glass epoxy board is prepared. The epoxy resin is in a semi-cured state (B-stage state).

A very thin carrier-laminated copper foil 2 "CopperBond® Extra Thin Foil" (Japan Olin Brass Corp.) is bonded to both upper and lower sides of the board 1 using a heat press so as to sandwich the glass epoxy board 1. The copper foil 2 has the sandwich structure comprising very thin copper foil 4 (3 μm)/release layer/carrier copper foil 3 (18 μm). As illustrated in FIG. 3A, the glass epoxy board 1 and the very thin carrier-laminated copper foil 2 are bonded together by laminating the surface of the very thin copper foil 4 on the glass epoxy board 1.

Using a drill, as illustrated in FIG. 3B, 150 μm-diameter through-holes 5 are formed at specified positions of the double-sided wiring base material fabricated.

Subsequently, as illustrated in FIG. 3C, the carrier layers 3 made of 18 μm-thick copper foil are stripped from the upper and lower sides of the glass epoxy board 1 with copper foil laminated on both sides thereof, thereby completing a 3-layer structure material with the through-holes formed therethrough, which has the glass epoxy board 1 at the center, and 3-μm very thin copper foil 4 on the upper and lower sides of the board 1.

Subsequently, the 3-layer structure material is immersed in a palladium ion-containing solution, to add the palladium catalyst to the insulating surface of the through-hole 5 walls, followed by immersion of the 3-layer structure material in an electroless copper plating solution to apply copper plating to the entire surface including the through-hole 5 walls, thereby electrodepositing an approximately 0.5 μm-thick electroless copper plating film 6, as illustrated in FIG. 3D.

Subsequently, the 3-layer structure material with the electroless copper plating film 6 applied thereto is immersed in an electrolytic copper plating solution, followed by electroplating treatment (both upper and lower very thin copper foil 4 serving as a cathode), thereby electrodepositing a 15 μm-thick electrolytic copper plating film 7 on both the upper and lower copper foil and on the through-hole 5 walls, as illustrated in FIG. 3E. In this case, the plating thickness of the through-hole 5 inner walls is 15 μm, while the thicknesses of the upper and lower copper foil are both 18 μm (=initial 3 μm+copper plating 15 μm).

Subsequently, a liquid photoresist is applied to both the upper and lower copper foil of the 3-layer structure material with the electrolytic copper plating film 7 applied thereto, which is followed by dry-curing and subsequent specified steps of light exposure and development, thereby forming a resist pattern. And aqueous ferric chloride is sprayed to the copper foil surface to dissolve and remove exposed copper foil portions which are uncovered with photoresist. Next, the photoresist film is stripped and removed by a specified method, thereby completing a fine wiring pattern 8 of copper on both the upper and lower sides, as illustrated in FIG. 3F. The minimum pattern pitch is 60 μm.

Subsequently, plating-unwanted portions on the fine wiring pattern 8 are covered with solder resist, followed by electroplating of 0.5 μm thick nickel and subsequent 0.5 μm thick gold, thereby forming a surface treatment film 9, thus completing a double-sided wiring board for mounting electronic components, as illustrated in FIG. 3G.

Embodiment 2

FIGS. 4A-4I are cross-sectional views showing the respective steps of a double-sided wiring board (flexible double-sided wiring board) fabrication process of embodiment 2 according to the invention using a polyimide board (blind via-hole processing).

A total 25 μm thick and 70 mm wide polyimide tape (a polyimide board 10) with a thermoplastic polyimide-based adhesive applied to both sides thereof is prepared of a few 10 m.

Using a heat press, as illustrated in FIG. 4A, a very thin carrier-laminated copper foil 2 "CopperBond® Extra Thin Foil" (Japan Olin Brass Corp.) is bonded to one side of the polyimide board 10, and a 12 μm thick electrolytic copper foil 11 is bonded to the other side thereof, so as to sandwich the polyimide board 10. The very thin carrier-laminated copper foil 2 has the sandwich structure comprising very thin copper foil 4 (3 μm)/release layer/carrier copper foil 3 (18 μm). The polyimide board 10 and the very thin carrier-laminated copper foil 2 are bonded together by laminating the surface of the very thin copper foil 4 on the polyimide board 10.

Subsequently, as illustrated in FIG. 4B, the carrier layer 3 made of 18 μm-thick copper foil of the very thin carrier-laminated copper foil 2 is stripped from the polyimide board 10 with the copper foil laminated on both sides thereof, thereby completing a 3-layer structure material which has the polyimide board 10 at the center, 3-μm very thin copper foil 4 on the upper side and typical 12-μm electrolytic copper foil 11 on the lower side.

Subsequently, using a YAG laser, as illustrated in FIG. 4C, 50 μm-diameter blind via-holes 12 (having a bottom) are formed at specified positions of the very thin copper foil 4 of the 3-layer structure material. Smears after hole formation by the laser are removed by a wet method.

Subsequently, as illustrated in FIG. 4D, the entire exposed surface of the electrolytic copper foil 11 of the 3-layer structure material is masked with a chemical-resistant adhesive PET tape 13, followed by immersion in a palladium ion-containing solution, to add the palladium catalyst 14 (FIG. 4E) to the insulating surface of the via-hole 12 walls.

Subsequently, the 3-layer structure material with the palladium catalyst 14 added thereto is immersed in an electrolytic copper plating solution, followed by electroplating treatment (the very thin copper foil 4 serving as a cathode), thereby directly electrodepositing a 15 μm-thick electrolytic copper plating film 7 on the very thin copper foil 4 and on the via-hole 12 walls, as illustrated in FIG. 4F. In this case, the plating thickness of the via-hole 12 inner walls is 15 μm, while the thickness of the very thin copper foil 4 is 18 μm (=initial 3 μm+copper plating 15 μm).

Subsequently, as illustrated in FIG. 4G, the masking tape 13 is stripped from the electrolytic copper foil 11.

Subsequently, a liquid photoresist is applied to both the upper and lower copper foil surfaces of the 3-layer structure material with the electrolytic copper plating film 7 applied thereto, which is followed by dry-curing and subsequent specified steps of light exposure and development, thereby forming a resist pattern. And aqueous ferric chloride is sprayed to the upper and lower copper foil surfaces to dissolve and remove exposed copper foil portions which are uncovered with photoresist. Next, the photoresist film is stripped and removed by a specified method, thereby completing a fine wiring pattern 8 of copper on both the upper and lower sides, as illustrated in FIG. 4H. The minimum pattern pitch is 60 μm on the via-hole open side with the 18 μm film made thick by plating the via-holes, while the minimum pattern pitch is 44 μm on the 12 μm thick copper foil side with no plating being electrodeposited by the tape masking.

Subsequently, plating-unwanted portions on the fine wiring pattern 8 are covered with solder resist, followed by electroplating of 0.5 μm thick nickel and subsequent 0.5 μm thick gold, thereby forming a surface treatment film 9, thus completing a flexible double-sided wiring board for mounting electronic components, as illustrated in FIG. 4I.

Here, the copper plating method for the electrical conduction of the blind via-holes 12 is shown as a conformal plating method for depositing plating along the via-hole 12 walls, but is not limited thereto, and may use a via-filling plating method in which the blind via-holes 12 are substantially completely filled by anisotropic growth caused by adding a trace additive to the copper plating solution.

Embodiment 3

FIGS. 5A-5I are cross-sectional views showing the respective steps of a double-sided wiring board (flexible double-sided wiring board) fabrication process of embodiment 3 according to the invention using a polyimide board (blind via-hole processing).

A total 25 μm thick and 70 mm wide polyimide tape (a polyimide board 10) with a thermoplastic polyimide-based adhesive applied to both sides thereof is prepared of a few 10 m.

Using a heat press, as illustrated in FIG. 5A, a very thin carrier-laminated copper foil 2 "CopperBond® Extra Thin Foil" (Japan Olin Brass Corp.) is bonded to both sides of the polyimide board 10 so as to sandwich the polyimide board 10. The very thin carrier-laminated copper foil 2 has the sandwich structure comprising very thin copper foil 4 (3 μm)/release layer/carrier copper foil 3 (18 μm). The polyimide board 10 and the very thin carrier-laminated copper foil 2 are bonded together by laminating the surface of the very thin copper foil 4 on the polyimide board 10.

Figure 5B:
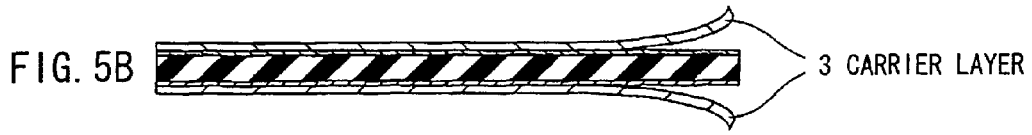

Subsequently, as illustrated in FIG. 5B, the carrier layers 3 made of 18 μm-thick copper foil of the carrier-laminated copper foil 2 on both sides are stripped, thereby completing a 3-layer structure material which has the polyimide board 10 at the center, and 3-μm very thin copper foil 4 on the upper and lower sides.

Figure 5C:

Subsequently, using a YAG laser, as illustrated in FIG. 5C, 50 μm-diameter blind via-holes 12 (having a bottom) are formed at specified positions of the very thin copper foil 4 of the 3-layer structure material. Smears due to the laser processing are removed by a wet method.

Figure 5D:
Figure 5E:

Subsequently, as illustrated in FIG. 5D, the entire exposed surface of the very thin copper foil 4 opposite the via-hole opening surface of the 3-layer structure material is masked with a chemical-resistant adhesive PET tape 13, followed by immersion in a palladium ion-containing solution, to add the palladium catalyst 14 (FIG. 5E) to the insulating surface of the via-hole 12 walls.

Figure 5F:

Subsequently, the 3-layer structure material with the palladium catalyst 14 added thereto is immersed in an electrolytic copper plating solution, followed by electroplating treatment (the very thin copper foil 4 serving as a cathode), thereby directly electrodepositing a 15 μm-thick electrolytic copper plating film 7 on the very thin copper foil 4 and on the via-hole 12 walls, as illustrated in FIG. 5F. In this case, the plating thickness of the via-hole 12 inner walls is 15 μm, while the thickness of the exposed very thin copper foil surface is 18 μm (=initial 3 μm+copper plating 15 μm).

Figure 5G:
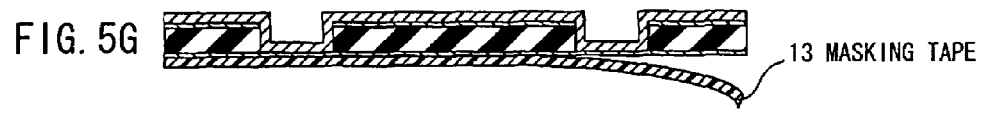

Subsequently, as illustrated in FIG. 5G, the masking tape 13 is stripped from the 3 μm thick very thin copper foil 4 opposite the opening surface.

Figure 5H:
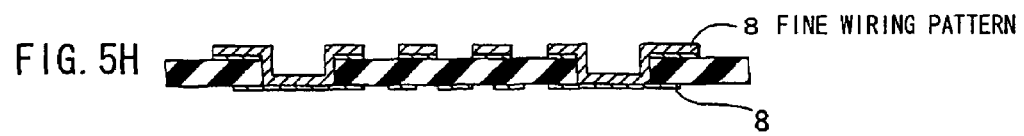

Subsequently, a liquid photoresist is applied to both the upper and lower copper foil surfaces of the 3-layer structure material with the electrolytic copper plating film 7 applied thereto, which is followed by dry-curing and subsequent specified steps of light exposure and development, thereby forming a resist pattern. And aqueous ferric chloride is sprayed to the upper and lower copper foil surfaces to dissolve and remove exposed copper foil portions which are uncovered with photoresist. Next, the photoresist film is stripped and removed by a specified method, thereby completing a fine wiring pattern 8 of copper on both the upper and lower sides, as illustrated in FIG. 5H. The minimum pattern pitch is 60 μm on the via-hole open side with the 18 μm film made thick by plating the via-holes, while an ultra-fine wiring pattern 8 with a pitch of 30 μm is verified to be possible on the 3 μm thick very thin copper foil 4 side with no copper plating being electrodeposited by the tape masking during plating the via-holes.

Figure 5I:
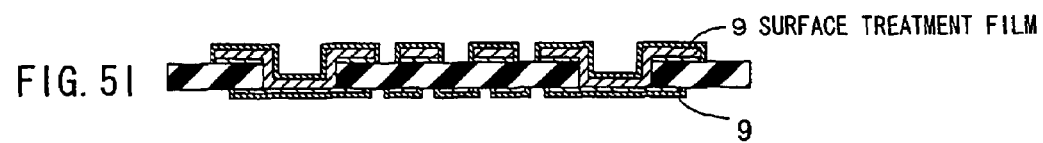
Figure 6A:
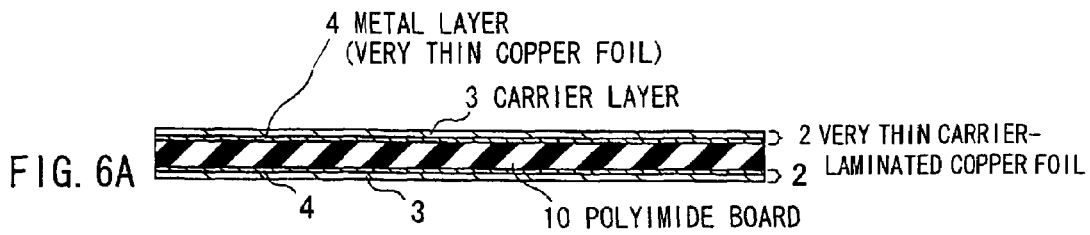
FIGS. 6A-6I are cross-sectional views showing the respective steps of a double-sided wiring board (flexible double-sided wiring board) fabrication process of preferred embodiment 4 according to the invention using a polyimide board (blind via-hole processing).
Figure 6B:
Figure 6C:
Figure 6D:
Figure 6E:
Figure 6F:
Figure 6G:
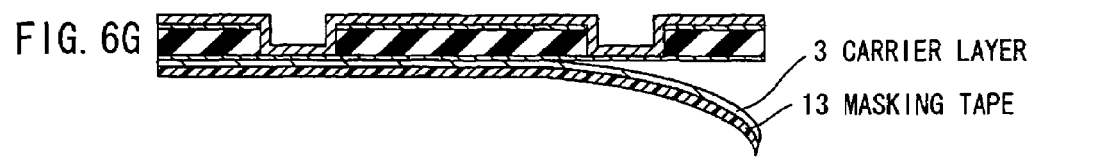
Figure 6H:
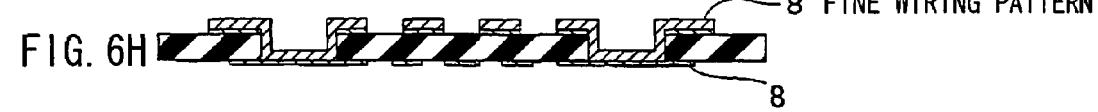
Figure 6I:
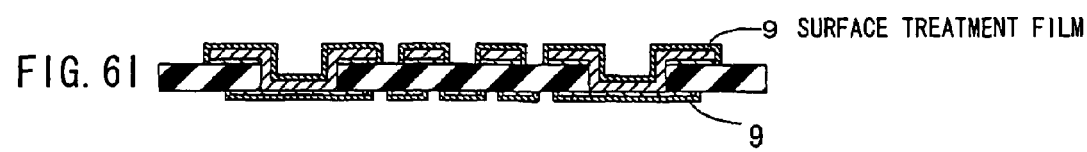

Subsequently, plating-unwanted portions on the fine copper wiring pattern 8 are covered with solder resist, followed by electroplating of 0.5 μm thick nickel and subsequent 0.5 μm thick gold, thereby forming a surface treatment film 9, thus completing a flexible double-sided wiring board for mounting electronic components, as illustrated in FIG. 5I.

Embodiment 4

FIGS. 6A-6I are cross-sectional views showing the respective steps of a double-sided wiring board (flexible double-sided wiring board) fabrication process of embodiment 4 according to the invention using a polyimide board (blind via-hole processing).

While, in embodiment 3, the carrier layers 3 of the carrier-laminated copper foil 2 laminated on both sides of the polyimide board 10 are both stripped prior to laser processing of vias, a carrier layer opposite the opening surface may, as in embodiment 4, be stripped immediately before copper foil molding by etching instead of stripping prior to laser processing of vias.

Since this method leaves the carrier layer 3 opposite the hole opening surface until plating via-holes, the mechanical strength of the polyimide board 10 can be maintained high, and conveyance is very satisfactory. Also, when a masking tape 13 is stripped, the carrier layer 3 is easily stripped with very weak force, so the mechanical stress load on the very thin copper foil 4 caused by stripping can be relieved, thereby causing no damage to the very thin copper foil 4, compared to the method of embodiment 3 in which the masking tape 13 is laminated directly on the very thin copper foil 4.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A method for fabricating a double-sided wiring board for mounting an electronic component thereon comprising metal wiring patterns formed both on upper and lower sides of an electrically-insulating board, the method comprising in the following order:
    laminating a metal layer with a support substrate on both side of the electrically-insulating board, the metal wiring patterns being formed by the metal layer;
    forming a through-hole and/or a blind via-hole in the electrically-insulating board through the metal layer with the support substrate on at least one side of the electrically-insulating board after said laminating;
    removing the support substrate from the metal layer after said forming so that the metal layer is left on the electrically-insulating board; and
    electrically connecting the metal wiring patterns to each other through the through-hole and/or the blind via-hole after said removing said support substrate,
    wherein the metal layer with the support substrate comprises a carrier layer of a metal material, a release layer formed on the carrier layer, and the metal layer formed on the release layer, and
    wherein the metal layer is bonded to the electrically-insulating board.

2. The method for fabricating a double-sided wiring board according to claim 1, wherein:
    the metal layer comprises a copper or copper alloy foil, a stainless foil, an aluminum or aluminum alloy foil, a nickel or nickel alloy foil, or a tin or tin alloy foil.

3. The method for fabricating a double-sided wiring board according to claim 1, wherein:
    the metal layer has a bond strength between the metal layer and the carrier layer via the release layer smaller than between the metal layer and the electrically-insulating board.

4. The method for fabricating a double-sided wiring board according to claim 1, wherein:
    the metal layer has a thickness of 1 μm or greater and 8 μm or less.

5. The method for fabricating a double-sided wiring board according to claim 1, wherein:
    the metal layer has a thickness smaller than the carrier layer.

6. The method for fabricating a double-sided wiring board according to claim 1, wherein the electrically connecting the metal wiring patterns comprises at least one of electrolytic plating and electroless plating on a wail of the through-hole or the blind via-hole.

7. The method for fabricating a double-sided wiring board according to claim 1, wherein said metal layer is other than sticking to said support substrate during said removing said support substrate.

8. The method for fabricating a double-sided wiring board according to claim 1, wherein said electrically connecting said metal wiring patterns comprises forming one of copper plating film, electrolytic copper plating film, and palladium on the metal layer directly.

9. The method for fabricating a double-sided wiring board according to claim 1, wherein said metal layer is other than sticking to said carrier layer during said removing said support substrate.

* * * * *